(12) United States Patent
Sone et al.

(10) Patent No.: US 8,767,402 B2
(45) Date of Patent: Jul. 1, 2014

(54) ELECTRICAL EQUIPMENT CASING

(75) Inventors: Mitsuo Sone, Chiyoda-ku (JP);
Nobuhiro Kihara, Chiyoda-ku (JP);
Naoki Itoi, Chiyoda-ky (CN); Fumito Uemura, Chiyoda-ku (JP)

(73) Assignee: Mitsubishi Electric Corporation, Tokyo (JP)

(*) Notice: Subject to any disclaimer, the term of this patent is extended or adjusted under 35 U.S.C. 154(b) by 234 days.

(21) Appl. No.: 13/348,881

(22) Filed: Jan. 12, 2012

(65) Prior Publication Data
US 2013/0050952 A1 Feb. 28, 2013

(30) Foreign Application Priority Data

Aug. 31, 2011 (JP) .................................. 2011-188752

(51) Int. Cl.
*H05K 7/20* (2006.01)
(52) U.S. Cl.
USPC ........... 361/720; 361/704; 361/707; 361/709; 361/679.54; 361/719; 165/80.3; 165/104.33; 257/706; 257/707; 257/713
(58) Field of Classification Search
USPC .............. 361/679.46–679.54, 690–697, 361/704–727; 165/80.2–80.5, 104.33, 165/121–126, 185; 174/15.1, 16.3, 17 R, 174/17.06, 17.08, 50, 50.52, 520; 312/223.2, 236; 363/141–144; 257/706–727
See application file for complete search history.

(56) References Cited

U.S. PATENT DOCUMENTS

| | | | | |
|---|---|---|---|---|
| 4,707,726 A * | 11/1987 | Tinder | ......................... | 174/252 |
| 4,908,734 A * | 3/1990 | Fujioka | ......................... | 361/703 |
| 5,323,295 A * | 6/1994 | Pines | ............................ | 361/709 |
| 5,373,418 A * | 12/1994 | Hayasi | ......................... | 361/707 |
| 6,320,776 B1 * | 11/2001 | Kajiura et al. | ................ | 363/141 |
| 6,573,616 B2 * | 6/2003 | Yamane | ...................... | 307/10.1 |
| 6,650,559 B1 * | 11/2003 | Okamoto et al. | ............ | 363/141 |
| 6,724,627 B2 * | 4/2004 | Onizuka et al. | ............... | 361/704 |
| 6,791,183 B2 * | 9/2004 | Kanelis | ........................ | 257/718 |
| 6,998,740 B2 * | 2/2006 | Matsuki | ......................... | 310/64 |

(Continued)

FOREIGN PATENT DOCUMENTS

| | | | |
|---|---|---|---|
| JP | 59002566 A | 1/1984 | |
| JP | 62254411 A | 11/1987 | |

(Continued)

OTHER PUBLICATIONS

Japanese Office Action, issued Jul. 23, 2013, Patent Application No. 2011-188752.

*Primary Examiner* — Michail V Datskovskiy
(74) *Attorney, Agent, or Firm* — Sughrue Mion, PLLC

(57) ABSTRACT

An electrical equipment casing includes a circuit board on which many electrical parts are mounted and a heat sink to which the circuit board is fixed. The heat sink is provided with a reactor housing dent that opens in a surface on which the circuit board is placed and radiator fins that reach a bottom portion of the reactor housing dent on a surface opposite to the surface on which the circuit board is placed at a position surrounding an outer circumference of the reactor housing dent. The reactor is housed in the reactor housing dent and a terminal thereof is electrically connected to the circuit board. This structure of the electrical equipment casing can contribute to an achievement of both of a size reduction of the overall casing and enhanced heat dissipation of the reactor.

18 Claims, 11 Drawing Sheets

(56) References Cited

U.S. PATENT DOCUMENTS

| | | | |
|---|---|---|---|
| 7,310,233 B2 * | 12/2007 | Bell | 361/704 |
| 7,663,886 B2 * | 2/2010 | Aoki et al. | 361/715 |
| 7,715,195 B2 * | 5/2010 | Bremicker et al. | 361/714 |
| 7,742,304 B2 * | 6/2010 | Heise et al. | 361/702 |
| 7,839,641 B2 * | 11/2010 | Baba et al. | 361/711 |
| 7,872,868 B2 * | 1/2011 | Yamanaka | 361/709 |
| 7,898,806 B2 * | 3/2011 | Isomoto | 361/697 |
| 8,520,381 B2 * | 8/2013 | Hobein et al. | 361/679.54 |
| 2005/0270745 A1 | 12/2005 | Chen et al. | |

FOREIGN PATENT DOCUMENTS

| | | | | | |
|---|---|---|---|---|---|
| JP | 3-278596 A | | 12/1991 | | |
| JP | 03278596 A | | 12/1991 | | |
| JP | 10241970 A | | 9/1998 | | |
| JP | 2003243865 A | | 8/2003 | | |
| JP | 2004045680 A | | 2/2004 | | |
| JP | 2005072198 A | | 3/2005 | | |
| JP | 2005340698 A | | 12/2005 | | |
| JP | 2006156465 A | | 6/2006 | | |
| JP | 2007194564 A | | 8/2007 | | |
| JP | 02007235054 A | * | 9/2007 | | H01F 37/00 |
| JP | 02007312502 A | * | 11/2007 | | H02M 7/48 |
| JP | 2008502293 A | | 1/2008 | | |
| JP | 2008112856 A | | 5/2008 | | |
| JP | 2008130964 A | | 6/2008 | | |
| JP | 2009099596 A | | 5/2009 | | |
| JP | 2010118503 A | | 5/2010 | | |
| JP | 02010267768 A | * | 11/2010 | | H01F 37/00 |
| JP | 2011-41397 A | | 2/2011 | | |

\* cited by examiner

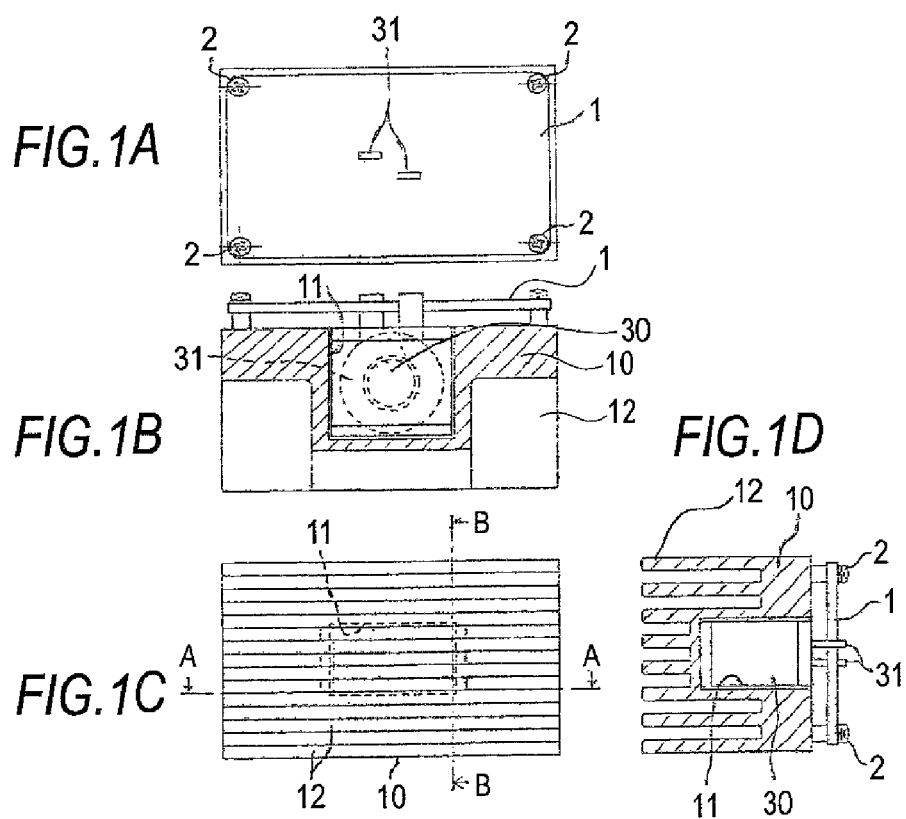

FIG.8A
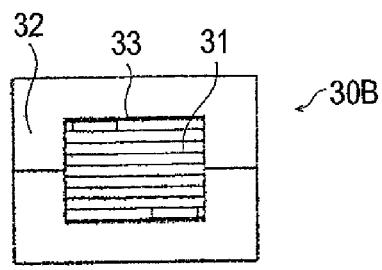
FIG.8B     FIG.8C
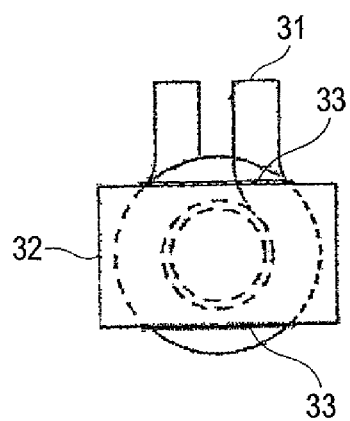 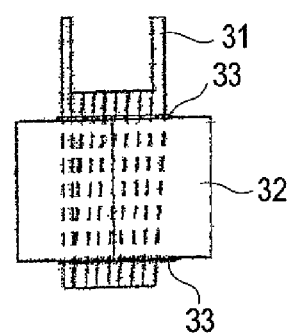

ELECTRICAL EQUIPMENT CASING

BACKGROUND OF THE INVENTION

1. Field of the Invention

The present invention relates to an electrical equipment casing that achieves both of enhanced heat dissipation and a size reduction of a reactor which is a heater part incorporated therein.

2. Related Art

Recently, automobiles furnished with an idle-stop function that stops engine driving when the automobiles are stationary or automobiles incorporating electrical power steering that reduces an engine load are made available in consideration of environmental friendliness and from the viewpoint of improvement of fuel efficiency. Also, a hybrid system that actively assists engine driving, a regenerative braking system that recovers braking energy as electric energy during vehicle braking and the like are attracting attention. In the context of the foregoing, electric power the automobiles need tends to increase and there has been proposed a configuration to provide a DC-to-DC convertor that generates electric power at high efficiency by setting a generated voltage of a generator high and steps down the voltage to a battery voltage.

In a DC-to-DC convertor, which is electrical equipment that controls a large current, one of chief heat releasing sources is a reactor. In order to enhance heat releasing efficiency of the reactor, heat dissipation is enhanced by housing the reactor in a casing having high heat conductivity or by molding the reactor from insulating resin having high heat conductivity. In this regard, a technique of enhancing heat dissipation of the reactor is now proposed, for example, in Patent Document 1. In electrical equipment in the related art provided with a reactor integral with a heat sink, the heat sink has a reactor housing portion. Accordingly, thermal resistance such that occurs in a configuration in which a heat transfer path bridges from one part to another different part does not exist. It thus becomes possible to enhance heat releasing efficiency of the reactor.

Patent Document 1: JP-A-2011-41397

With the casing structure described in Patent Document 1, it does become possible to enhance heat dissipation of the reactor. However, because a dimension of radiator fins provided to the heat sink is added to the reactor housing portion, this structure has a problem that the overall casing increases in size.

SUMMARY OF THE INVENTION

The invention is devised to solve the problem in the related art as described above and has an object to achieve a size reduction of an electrical equipment casing while enhancing heat dissipation of a reactor.

An electrical equipment casing according to an aspect of the invention includes a circuit board on which many electrical parts are mounted and a heat sink to which the circuit board is fixed. The heat sink is provided with a reactor housing dent that opens in a surface on which the circuit board is placed and radiator fins that reach a bottom portion of the reactor housing dent on a surface opposite to the surface on which the circuit board is placed at a position surrounding an outer circumference of the reactor housing dent. A reactor is housed in the reactor housing dent and a terminal thereof is electrically connected to the circuit board.

According to the invention, the radiator fins are provided to the heat sink at a position surrounding the outer circumference of the reactor housing dent and the reactor is housed in the dent in such a manner that the bottom of the reactor housing dent reaches substantially the tip ends of the radiator fins. Hence, not only can the electrical equipment casing be reduced in size, but also heat dissipation of the reactor can be enhanced at the same time.

The foregoing and other object, features, aspects, and advantages of the present invention will become more apparent from the following detailed description of the present invention when taken in conjunction with the accompanying drawings.

BRIEF DESCRIPTION OF THE DRAWINGS

FIG. 1A is a top view of an electrical equipment casing according to a first embodiment of the invention, FIG. 1B is a sectional front view, FIG. 1C is a bottom view, and FIG. 1D is a sectional side view of the electrical equipment casing;

FIG. 8A is a top view of a reactor according to the sixth embodiment of the invention, FIG. 8B is a front view, and FIG. 8C is a side view of the reactor;

DESCRIPTION OF THE PREFERRED EMBODIMENTS

First Embodiment

Figure 2A:
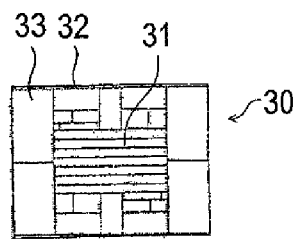
FIG. 2A is a top view of a reactor according to the first embodiment of the invention.

FIGS. 1A through 1D are views showing an electrical equipment casing according to a first embodiment of the invention. FIG. 1A is a top view, FIG. 1B is a sectional front view taken on line A-A, FIG. 1C is a bottom view, and FIG. 1D is a sectional side view taken on line B-B. Referring to FIGS. 1A through 1D, an electrical equipment casing of the invention includes a circuit board 1 on which many electrical parts are mounted and a heat sink 10 to which the circuit board 1 is fixed at four corners with screws 2. The heat sink 10 is made of metal having satisfactory heat conductivity. The heat sink 10 is provided with a reactor housing dent 11, for example, of a rectangular prism shape that houses a reactor 30 in a surface on which the circuit board 1 is placed. On an entire surface of the heat sink 10 opposite to the surface on which the circuit board 1 is placed, plate-shaped (sheet) fins 12 are provided integrally with the heat sink 10. In the example of FIG. 1, the plate-shaped fins 12 extend parallel to a long side direction of the reactor housing dent 11 of a rectangular prism shape and are provided to surround the reactor housing dent 11 in close proximity to a bottom of the reactor housing dent 11 and the periphery of the reactor housing dent 11. In the drawings, the reactor housing dent 11 is provided to a portion opposing the circuit board 1 in the heat sink 10 on which the circuit board 1 is placed. The reactor housing dent 11, however, may be provided on an extended surface of the heat sink 10 that does not oppose the circuit board 1.

Figure 2B:
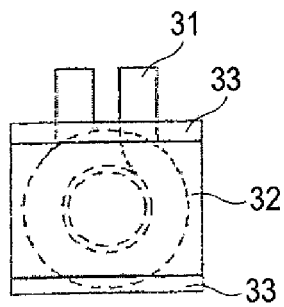
FIG. 2B is a front view.
Figure 2C:
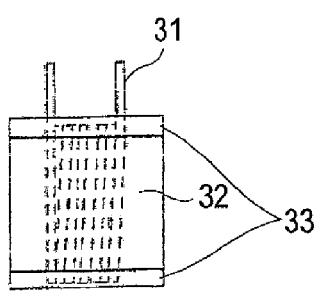
FIG. 2C is a side view of the reactor.

The reactor housing dent 11 of the heat sink 10 houses the reactor 30 described in detail below with reference to FIGS. 2A through 2C and an end of a coil 31 of the reactor 30 is electrically connected to the circuit board 1. As are shown in FIGS. 2A through 2C, the reactor 30 includes the coil 31, a core 32 having a magnetic path, and a bobbin 33 protecting the coil 31 and keeping the coil 31 electrically isolated from the core 32. The reactor 30 is housed in the reactor housing dent 11 while being in contact with the side surfaces and the bottom of the reactor housing dent 11 first and then fixed to the heat sink 10, for example, with unillustrated screws.

According to the electrical equipment casing configured as above, the heat sink 10 can receive the reactor 30 so as to wrap the reactor 30 in the reactor housing dent 11. Hence, because three surfaces of the reactor 30 come into contact with the heat sink 10, a heat conducting area increases and heat releasing efficiency of the reactor 30 is enhanced. Also, because the reactor housing dent 11 is formed by breaking into the plate-shaped fins 12 provided to the heat sink 10, it becomes possible to reduce a size of the electrical equipment casing having the heat sink 10 integral with the reactor 30. More specifically, when the configuration above is not adopted, the casing increases in size by a height of the plate-shaped fins 12 of the heat sink 10. In contrast, by adopting the configuration above, it becomes possible to enhance heat dissipation of the reactor 30 while achieving a size reduction by making efficient use of the plate-shaped fins 12 of the heat sink 10.

Instead of housing the reactor 30 in the reactor housing dent 11 so as to come into close contact with the side surfaces of the reactor housing dent 11, slight clearances may be provided between the side surfaces of the reactor 30 and the reactor housing dent 11 to fill the clearances with elastic resin having satisfactory heat conductivity. In this case, both vibration resistance and heat dissipation can be enhanced.

Second Embodiment

Figure 3:
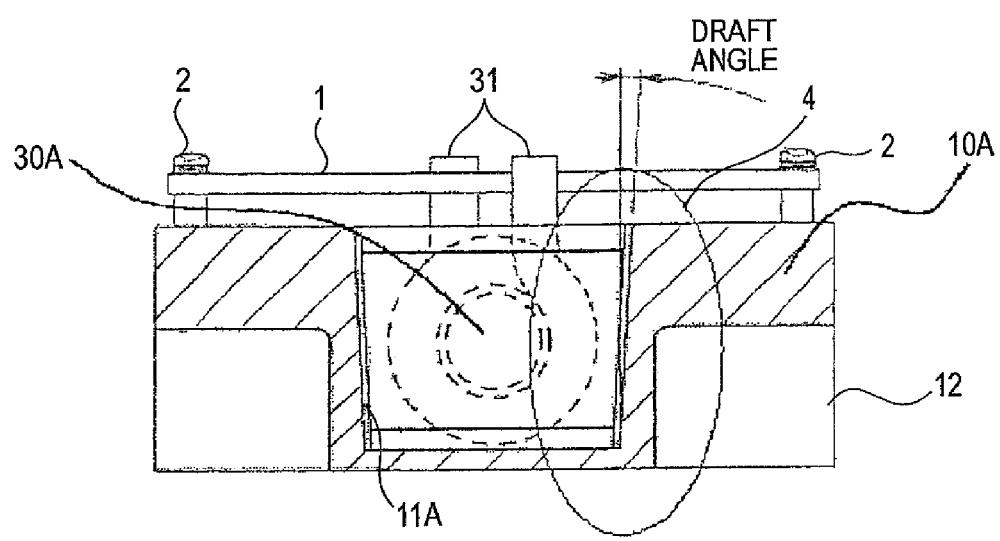
FIG. 3 is a sectional front view of an electrical equipment casing according to a second embodiment of the invention.

FIG. 3 is a sectional front view of an electrical equipment housing according to a second embodiment of the invention. Like components are labeled with like reference numerals with respect to FIGS. 1A through 1D and FIGS. 2A through 2C and a description of such components is omitted herein. A heat sink 10A of the second embodiment is of a flat shape having no fins on the dent bottom side. This shape, however, is not essential in the second embodiment and a heat sink of the same shape as the heat sink 10 shown in FIGS. 1A through 1D may be used as well. The second embodiment is characterized in that a reactor housing dent 11A with a draft angle 4 is formed as a reactor housing dent of the heat sink 10A when the heat sink 10A is manufactured using an aluminum die cast or a sand mold. In short, the reactor housing dent 11A has side surfaces having an interval that slightly narrows toward the bottom.

Meanwhile, a reactor 30A having side surfaces formed along the draft angle 4 is used as a reactor. The reactor 30A is inserted into the reactor housing dent 11A, and in this instance, the reactor 30A is inserted to a position at which the reactor 30A hits the bottom of the reactor housing dent 11A.

According to this structure, clearances between the reactor 30A and the heat sink 10A can be reduced without having to apply additional working on the heat sink 10A. It thus becomes possible to reduce thermal resistance and enhance heat dissipation and machinability. The reactor 30A, shown in FIG. 3, is stabilized when positioned by the end of the coil 31 electrically and mechanically connected to the circuit board 1 and the bottom of the reactor housing dent 11A.

Third Embodiment

Figure 4:
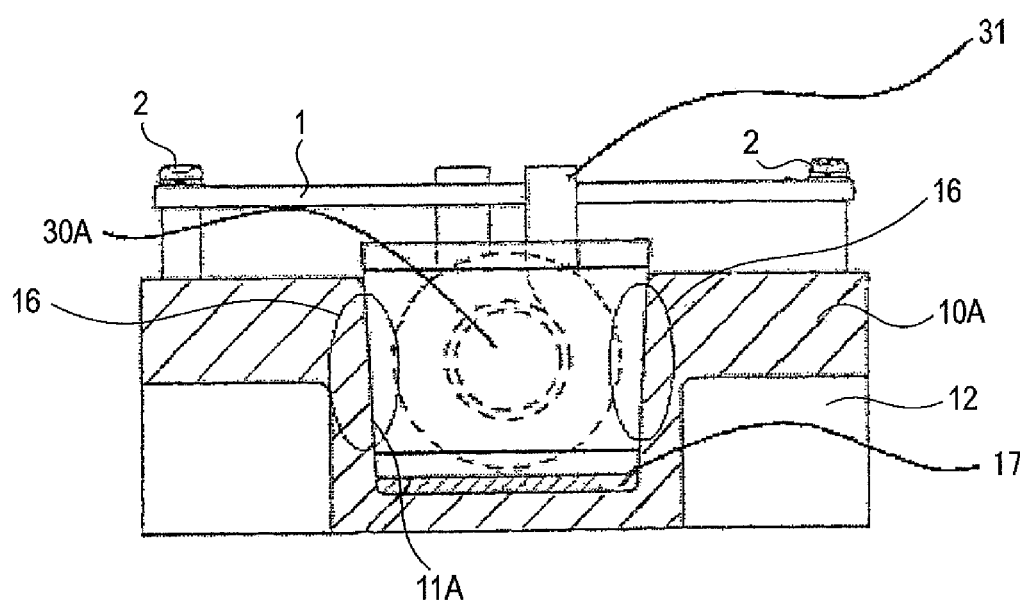
FIG. 4 is a sectional front view of an electrical equipment casing according to a third embodiment of the invention.

FIG. 4 is a sectional front view of an electrical equipment casing according to a third embodiment of the invention. Like components are labeled with like reference numerals with respect to FIGS. 1A through 1D, FIGS. 2A through 2C, and FIG. 3 and a description of such components is omitted herein. In the third embodiment, a heat sink 10A includes a reactor housing dent 11A with a draft angle 4 same as that of the second embodiment above. In the second embodiment above, when the reactor 30A is housed in the reactor housing dent 11A, the reactor 30A is inserted into the reactor housing dent 11A to a position at which the reactor 30A hits the bottom of the reactor housing dent 11A. In contrast, in the third embodiment, it is configured in such a manner that the reactor 30A is prevented from hitting the bottom of the reactor housing dent 11A even when four side surfaces of the reactor 30A are in close contact with four side surfaces of the reactor housing dent 11A. In this case, it is not necessary to bring all the four side surfaces of the reactor 30A into close contact with the four side surfaces of the reactor housing dent 11A. In some cases, opposing two side surfaces alone may be brought into close contact with the corresponding side surfaces of the reactor housing dent 11A and the other two surfaces may be slightly spaced apart from the other corresponding side surfaces of the reactor housing dent 11A.

As has been described, by making the reactor housing dent 11A of the heat sink 10A deeper, it becomes possible to bring the reactor 30A into close contact with the heat sink 10A at contact surfaces 16 while keeping the reactor 30A out of contact with the bottom of the reactor housing dent 11A. Heat dissipation can be therefore enhanced markedly. Also, in terms of machinability, because the tip end of the coil 31 is positioned with respect to the circuit board 1 by the position of the reactor housing dent 11A, positioning tools become unnecessary. Machinability can be therefore enhanced. Further, by flowing resin 17 into a clearance between the reactor 30A and the bottom of the dent 11A, it becomes possible to enhance vibration resistance and fix the reactor 30A in the dent 11A. A heat releasing effect can be therefore increased.

Fourth Embodiment

Figure 5:
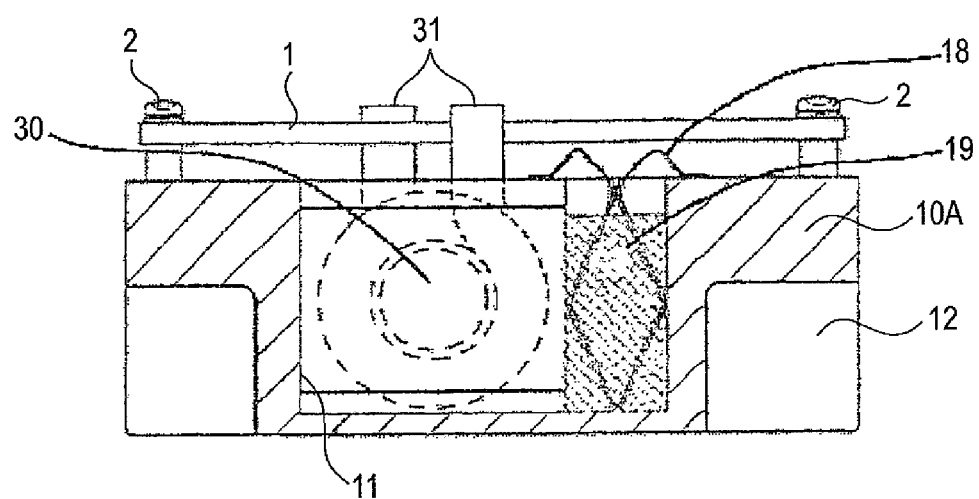
FIG. 5 is a sectional front view of an electrical equipment casing according to a fourth embodiment of the invention.

FIG. 5 is a sectional front view of an electrical equipment casing according to a fourth embodiment of the invention. Like components are labeled with like reference numerals with respect to FIGS. 1A through 1D, FIGS. 2A through 2C, and FIG. 3 and a description of such components is omitted herein. In the fourth embodiment, a length or a width (width in FIG. 5) of a reactor housing dent 11 provided to a heat sink 10A is made larger than a length or a width (width in FIG. 5) of a reactor 30. A blade spring 18 is inserted into a clearance between one side surface of the reactor 30 and the reactor housing dent 11 so that the reactor 30 is brought into close contact with the heat sink 10A by a pushing force of the blade spring 18. Other types of spring, such as a helical spring, may be used instead of a blade spring.

As has been described, by bringing the reactor 30 into direct contact with the heat sink 10A using the blade spring 18, heat conductivity is enhanced and so is the heat releasing effect. In comparison with a typical structure in which a reactor is fixed to a heat sink with screws, a larger contact surface area can be ensured between the heat sink 10A and the reactor 30 by inserting the reactor 30 into the reactor housing dent 11. Hence, heat dissipation can be enhanced. Further, by filling a space in which the blade spring 18 is installed with resin 19, vibration resistance can be enhanced. Even when a high priority is placed on heat shock and the cost and the resin 19 filling the space is epoxy resin less expensive than silicon resin having good heat conductivity, sufficient heat dissipation can be obtained.

Fifth Embodiment

Figure 6:
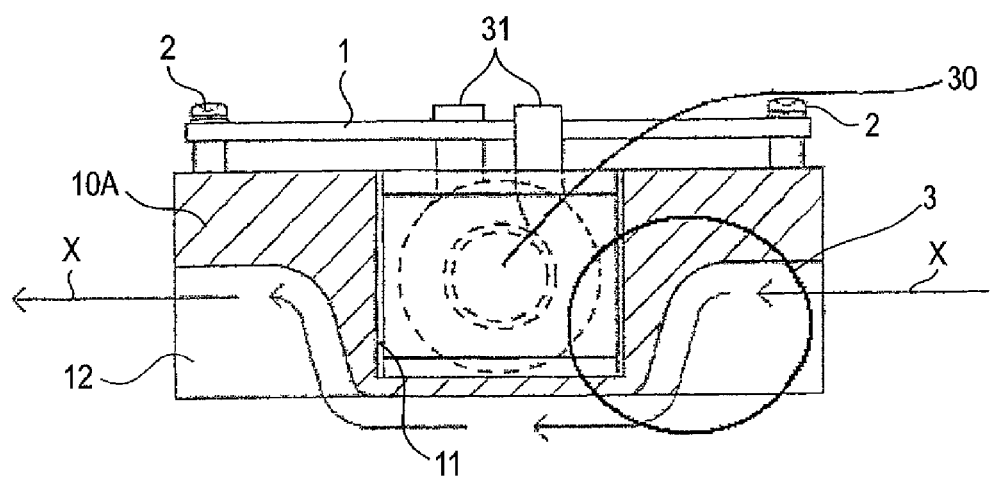
FIG. 6 is a sectional front view of an electrical equipment casing according to a fifth embodiment of the invention.

FIG. 6 is a sectional front view of an electrical equipment casing according to a fifth embodiment of the invention. Like components are labeled with like reference numerals with respect to FIGS. 1A through 1D, FIGS. 2A through 2C, and FIG. 3 and a description of such components is omitted herein. In the fifth embodiment, the bottoms of plate-shaped fins 12 on the both sides of a dent 11 of a heat sink 10A are formed into a smooth curved portion 3.

On the outer surface of the reactor housing dent 11 on the fin side, a pressure loss of cooling air flowing through among the plate-shaped fins 12 is large due to the presence of the reactor housing dent 11, thereby causing heat to remain in some cases. However, by forming the bottoms of the plate-shaped fins 12 into the smooth curved portions 3, an airflow adjusting function for cooling air indicated by arrows X can be obtained. A pressure loss of the cooling air is thus suppressed and the heat releasing effect can be enhanced. In addition, the curved portions 3 also form a draft angle generated in the process of working when the outer surface of the reactor housing dent 11 is manufactured using an aluminum die cast or a sand mold and are therefore formed easily.

Sixth Embodiment

Figure 7:
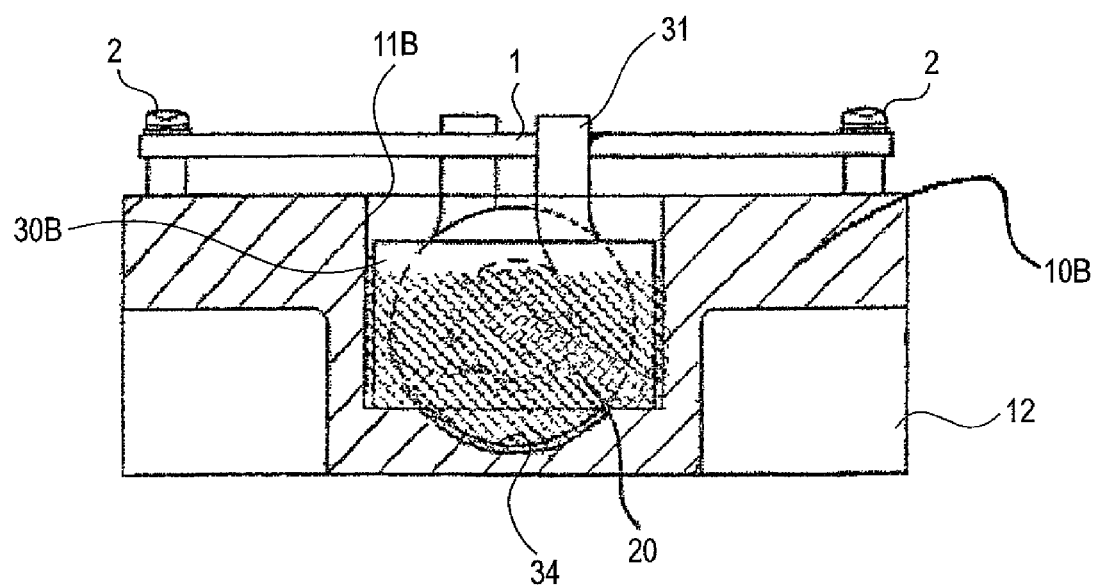
FIG. 7 is a sectional front view of an electrical equipment casing according to a sixth embodiment of the invention.

FIG. 7 is a sectional front view of an electrical equipment casing according to a sixth embodiment of the invention. Like components are labeled with like reference numerals with respect to FIGS. 1A through 1D, FIGS. 2A through 2C, and FIG. 3 and a description of such components is omitted herein. Prior to a description of FIG. 7, a reactor 30B of FIG. 7 will be descried with reference to FIGS. 8A through 8C. The reactor 30B includes a coil 31, a core 32, and a bobbin 33. It should be noted herein that the bobbin 33 is within the width of the core 32. Accordingly, the reactor 30B has a structure in which the periphery of a winding portion of the coil 31 protrudes from the top and the bottom of the core 32.

As is shown in FIG. 7, a reactor housing dent 11B of a heat sink 10B that houses the reactor 30B shaped as described above is provided with a concave portion 34 of a shape comforting to an outside diameter of the coil 31 of the reactor 30B. As the reactor 30B is housed in the reactor housing dent 11B provided with the concave portion 34, the both side surfaces and the bottom surface of the core 32 as well as the coil 31, which is a heater portion, of the reactor 30B come into direct contact with the heat sink 10B. It thus becomes possible to enhance heat dissipation of the reactor 30B and reduce a size of the overall electrical equipment casing.

By filling the reactor housing dent 11B with elastic resin 20 after the reactor 30B is inserted into the reactor housing dent 11B, vibration resistance can be enhanced. Also, heat dissipation can be enhanced using resin having satisfactory heat conductivity as the resin 20 to be filled in. Elastic resin having high heat conductivity, for example, silicon resin is desirable as the resin to be filled in.

Seventh Embodiment

Figure 9:
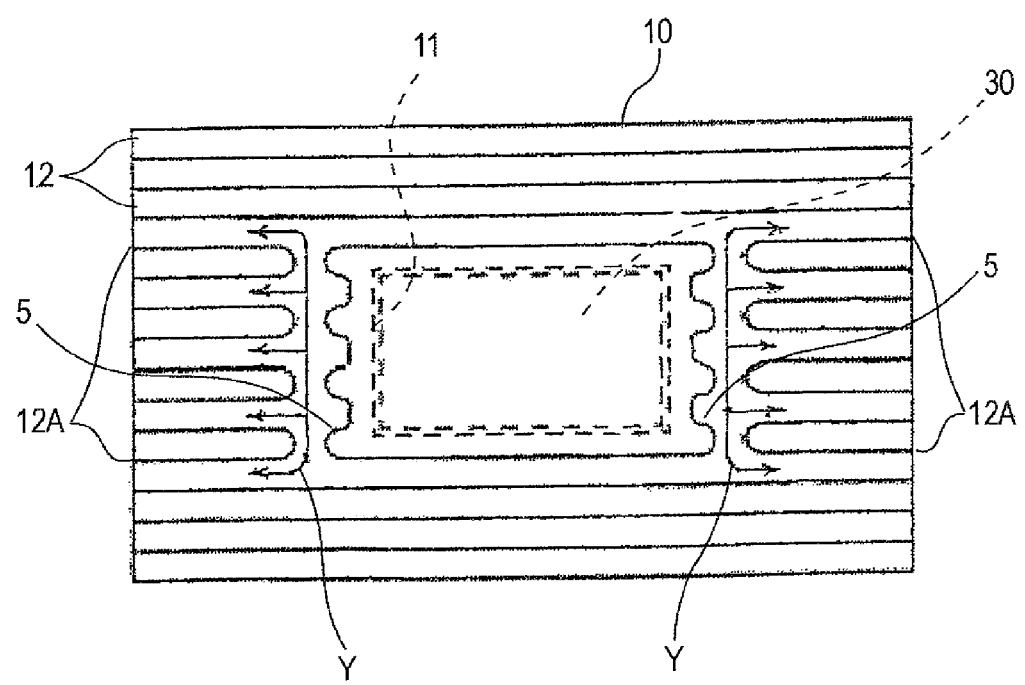
FIG. 9 is a bottom view of an electrical equipment casing according to a seventh embodiment of the invention.

FIG. 9 is a bottom view of an electrical equipment casing according to a seventh embodiment of the invention. In the seventh embodiment, as is shown in FIG. 9, notches 5 are made in plate-shaped fins 12A provided so as to extend from the outer side wall of the reactor housing dent 11 in portions close to the outer side wall. The rest of the configuration is the same as that shown in FIGS. 1A through 1D, FIG. 2A through 2C, and FIG. 3.

By providing the notches 5, not only does it become possible to form an escape route of fluid heat passing through among the plate-shaped fins 12A as indicated by arrows Y, but it also becomes possible to increase a surface area on the exterior surface on the periphery of the reactor 30. Heat dissipation can be thus enhanced.

Eighth Embodiment

Figure 10A:
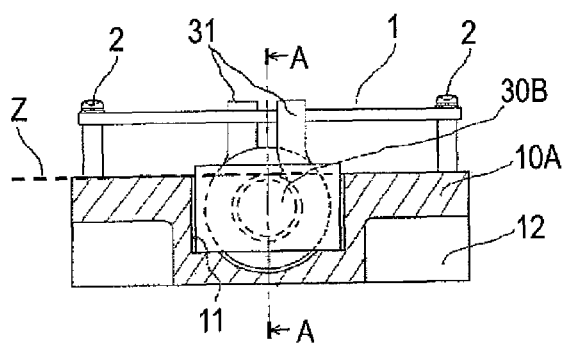
FIG. 10A is a sectional front view and FIG. 10B is a sectional side view of an electrical equipment casing according to an eighth embodiment of the invention.
Figure 10B:
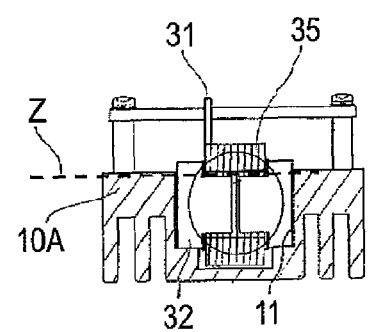
Figure 11A:
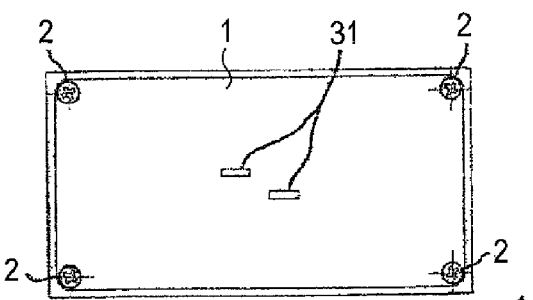
FIG. 11A is a top view of an electrical equipment casing according to a ninth embodiment of the invention.
Figure 11B:
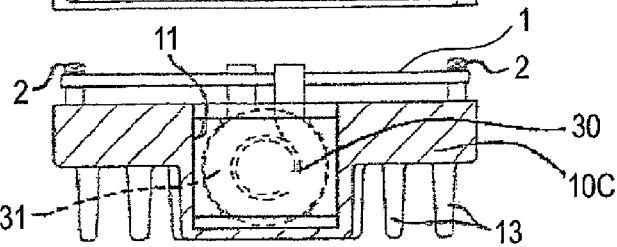
FIG. 11B is a sectional front view.
Figure 11C:
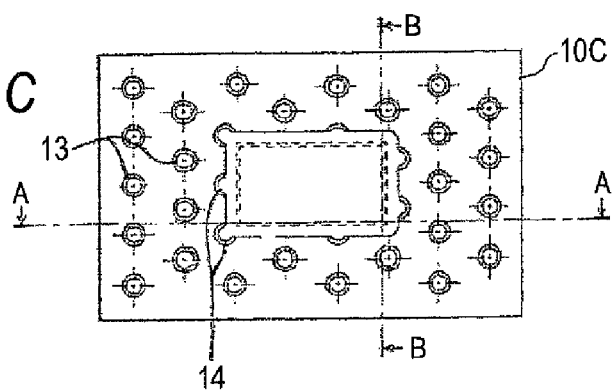
FIG. 11C is a bottom view.
Figure 11D:
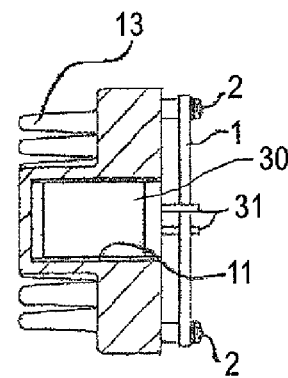
FIG. 11D is a sectional side view of the electrical equipment casing.

FIGS. 10A and 10B are views of an electrical equipment casing according to an eighth embodiment of the invention. FIG. 10A is a sectional front view and FIG. 10B is a sectional side view taken on line A-A. Like components are labeled with like reference numerals with respect to FIGS. 1A through 1D, FIGS. 2A through 2C, and FIG. 3 and a description of such components is omitted herein. In the eighth embodiment, as are shown in FIGS. 10A and 10B, a reactor 30B is inserted into a reactor housing dent 11 to an iron core upper limit position Z of a reactor core.

A leakage flux generated from the reactor 30B is generated from an air gap 35 (indicated within a solid circle) present chiefly in a reactor iron core portion. Hence, by inserting the reactor 30B into the heat sink 10 to the iron core upper limit position Z of the core of reactor 30B and making the heat sink 10 from aluminum or the like having good electric conduction, an amount of a flux leaking to the outside can be reduced. An effect of magnetic shielding can be thus obtained. Hence, even when the reactor 30B is disposed at a position opposing the center of the circuit board 1, influences of noises generated from the reactor 30B to the circuit board 1 become small. Accordingly, the reactor 30B can be installed without any restriction and can be installed freely to any desired portion including the center of the circuit board 1.

Ninth Embodiment

The configuration of an electrical equipment casing according to a ninth embodiment of the invention will now be described with reference to FIG. 11. The electrical equipment casing of the ninth embodiment includes a circuit board 1 on which many electrical parts are mounted, a reactor 30, and a heat sink 10C having a reactor housing dent 11 and pin-shaped fins 13. The term, "fins", referred to in the specification and the appended claims means members shaped so as to promote cooling and the shape thereof is not particularly limited.

Because the electrical equipment casing of this embodiment is of the same structure as the counterpart in the first embodiment above except for the heat sink 10C, a description will be chiefly given to the heat sink 10C. The reactor housing dent 11 that houses the reactor 30 from the side opposing the circuit board 1 is provided to the heat sink 10C in a center portion. Many pin-shaped fins 13 are implanted in the heat sink 10C on the surface opposite to the circuit board 1 except for a bottom portion of the reactor housing dent 11. Ribs 14 protruding from the side surfaces are provided to the lateral surface on the periphery of the reactor housing dent 11 to reinforce the side walls and increase a heat releasing area.

In the ninth embodiment, by adopting the pin-shaped fins 13, a direction of cooling air is not limited in comparison with plate-shaped fins and the pin-shaped fins 13 are exposed to cooling air coming from any direction. A heat releasing surface can be therefore larger in comparison with a plate-shaped fin. Also, by providing the ribs 14 on the outer surface of the reactor housing dent 11, mechanical strength is enhanced and the heat releasing area is increased. Heat dissipation can be therefore enhanced.

Various modifications and alterations of this invention will be apparent to those skilled in the art without departing from the scope and spirit of this invention, and it should be understood that this is not limited to the illustrative embodiments set forth herein.

What is claimed is:

1. An electrical equipment casing, comprising:
    a circuit board on which electrical parts are mounted; and
    a heat sink to which the circuit board is fixed,
wherein:
    the heat sink is provided with a reactor housing dent that opens in a surface on which the circuit board is placed and plate-shaped radiator fins that reach a bottom portion of the reactor housing dent on a surface opposite to the surface on which the circuit board is placed at a position surrounding an outer circumference of the reactor housing dent, wherein a notch is made in a part of the plate-shaped radiator fins; and
    a reactor is housed in the reactor housing dent and a terminal thereof is electrically connected to the circuit board.

2. An electrical equipment casing, comprising:
    a circuit board on which electrical parts are mounted; and
    a heat sink to which the circuit board is fixed,
wherein:
    the heat sink is provided with a reactor housing dent that opens in a surface on which the circuit board is placed and pin-shaped fins, which reach a bottom level of the reactor housing dent, implanted in the heat sink on a surface opposite to the surface on which the circuit board is placed; and
    a reactor is housed in the reactor housing dent and a terminal thereof is electrically connected to the circuit board, wherein protruding ribs are provided to an outer surface of the reactor housing dent.

3. The electrical equipment casing according to claim 1, wherein:
    the reactor housing dent after the reactor is inserted therein is filled with elastic resin.

4. The electrical equipment casing according to claim 2, wherein:
    the reactor housing dent after the reactor is inserted therein is filled with elastic resin.

5. The electrical equipment casing according to claim 1, wherein:
    the reactor housing dent after the reactor is inserted therein is filled with elastic heat-conductive resin.

6. The electrical equipment casing according to claim 2, wherein:
    the reactor housing dent after the reactor is inserted therein is filled with elastic heat-conductive resin.

7. The electrical equipment casing according to claim 1, wherein:
    the reactor is positioned by the terminal of the reactor electrically and mechanically connected to the circuit board and the bottom of the reactor housing dent.

8. The electrical equipment casing according to claim 2, wherein:
    the reactor is positioned by the terminal of the reactor electrically and mechanically connected to the circuit board and the bottom of the reactor housing dent.

9. The electrical equipment casing according to claim 1, wherein:
    the reactor housing dent is provided with a concave portion that contacts an outer circumference of a coil of the reactor.

10. The electrical equipment casing according to claim 2, wherein:
    the reactor housing dent is provided with a concave portion that contacts an outer circumference of a coil of the reactor.

11. The electrical equipment casing according to claim 1, wherein:
    an outside shape of the reactor is provided with an inclination equal to and along a draft angle generated when the reactor housing dent is formed.

12. The electrical equipment casing according to claim 2, wherein:
    an outside shape of the reactor is provided with an inclination equal to and along a draft angle generated when the reactor housing dent is formed.

13. The electrical equipment casing according to claim 1, wherein:
    bottoms of the plate-shaped fins in contact with outside wall surfaces of the reactor housing dent are formed in a curved shape.

14. The electrical equipment housing according to claim 1, wherein:
    a spring is inserted in one of clearances between side surfaces of the reactor and side surfaces of the reactor housing dent to push the reactor so that the side surfaces of the reactor come into close contact with the side surfaces of the reactor housing dent.

15. The electrical equipment housing according to claim 2, wherein:
    a spring is inserted in one of clearances between side surfaces of the reactor and side surfaces of the reactor housing dent to push the reactor so that the side surfaces of the reactor come into close contact with the side surfaces of the reactor housing dent.

16. The electrical equipment housing according to claim 14, wherein:
    a space in which the spring is installed is filled with elastic resin.

17. The electrical equipment housing according to claim 15, wherein:
    a space in which the spring is installed is filled with elastic resin.

18. An electrical equipment casing, comprising:
    a circuit board on which electrical parts are mounted; and
    a heat sink to which the circuit board is fixed, wherein:
    the heat sink is provided with a reactor housing dent that opens in a surface on which the circuit board is placed and fins, which reach a bottom level of the reactor housing dent, on a surface opposite to the surface on which the circuit board is placed; and
    a reactor is housed in the reactor housing dent and a terminal thereof is electrically connected to the circuit board, wherein an outside shape of the reactor is provided with an inclination equal to and along a draft angle generated when the reactor housing dent is formed.

\* \* \* \* \*